(12) United States Patent
Kenji

(10) Patent No.: US 9,117,922 B2
(45) Date of Patent: Aug. 25, 2015

(54) THIN FILM TRANSISTOR, THIN FILM TRANSISTOR SUBSTRATE AND METHOD OF MANUFACTURING THIN FILM TRANSISTOR SUBSTRATE

(71) Applicant: Ye Xin Technology Consulting Co., Ltd., Hsinchu (TW)

(72) Inventor: Anjo Kenji, Hsinchu (JP)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/145,688

(22) Filed: Dec. 31, 2013

(65) Prior Publication Data

US 2015/0028326 A1    Jan. 29, 2015

(30) Foreign Application Priority Data

Jul. 26, 2013    (TW) .............................. 102126810 U

(51) Int. Cl.
*H01L 21/04* (2006.01)
*H01L 21/8234* (2006.01)
*H01L 29/786* (2006.01)
*H01L 29/66* (2006.01)

(52) U.S. Cl.
CPC .... *H01L 29/78696* (2013.01); *H01L 29/66969* (2013.01); *H01L 29/78693* (2013.01)

(58) Field of Classification Search
None
See application file for complete search history.

(56) References Cited

U.S. PATENT DOCUMENTS

| | | | |
|---|---|---|---|
| 2011/0215331 A1* | 9/2011 | Yamazaki et al. | 257/60 |
| 2012/0119205 A1* | 5/2012 | Taniguchi et al. | 257/43 |
| 2012/0319114 A1* | 12/2012 | Yamazaki et al. | 257/57 |
| 2014/0113405 A1* | 4/2014 | Tsubuku et al. | 438/104 |
| 2014/0203277 A1* | 7/2014 | Shimomura | 257/43 |

OTHER PUBLICATIONS

Yao, Jianke, Ningsheng Xu, Shaozhi Deng, Jun Chen, Juncong She, Han-Ping David Shieh, Po-Tsun Liu, and Yi-Pai Huang. "Electrical and Photosensitive Characteristics of A-IGZO TFTs Related to Oxygen Vacancy." IEEE Transactions on Electron Devices 58.4 (2011): 1121-126.*

* cited by examiner

*Primary Examiner* — Joseph Schoenholtz
(74) *Attorney, Agent, or Firm* — Novak Druce Connolly Bove + Quigg LLP

(57) ABSTRACT

A thin film transistor includes a gate electrode, a channel layer, a source electrode, and a drain electrode. The channel layer is made of an amorphous oxide semiconductor. The channel layer includes one high oxygen ion concentration region, or two high oxygen ion concentration regions one above the other. An oxygen ion density of each high oxygen ion concentration region is in a range of from about $1\times10^{18}$ to about $1\times10^{21}$ per cubic centimeter. A thin film transistor substrate and a method of manufacturing the thin film transistor substrate are also provided.

7 Claims, 24 Drawing Sheets

THIN FILM TRANSISTOR, THIN FILM TRANSISTOR SUBSTRATE AND METHOD OF MANUFACTURING THIN FILM TRANSISTOR SUBSTRATE

BACKGROUND

1. Technical Field

The disclosure generally relates to display panel technologies; and more particularly, to a thin film transistor, a thin film transistor substrate and a method of manufacturing the thin film transistor substrate.

2. Description of Related Art

Generally, a channel layer of a thin film transistor is made of an amorphous oxide semiconductor. However, a density of oxygen ions in the channel layer is easily decreased during an etching process of a source electrode or a drain electrode of the thin film transistor. Therefore, electron mobility in the channel layer is adversely affected.

Thus it is desirable to provide a means which can overcome the above-mentioned problems.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
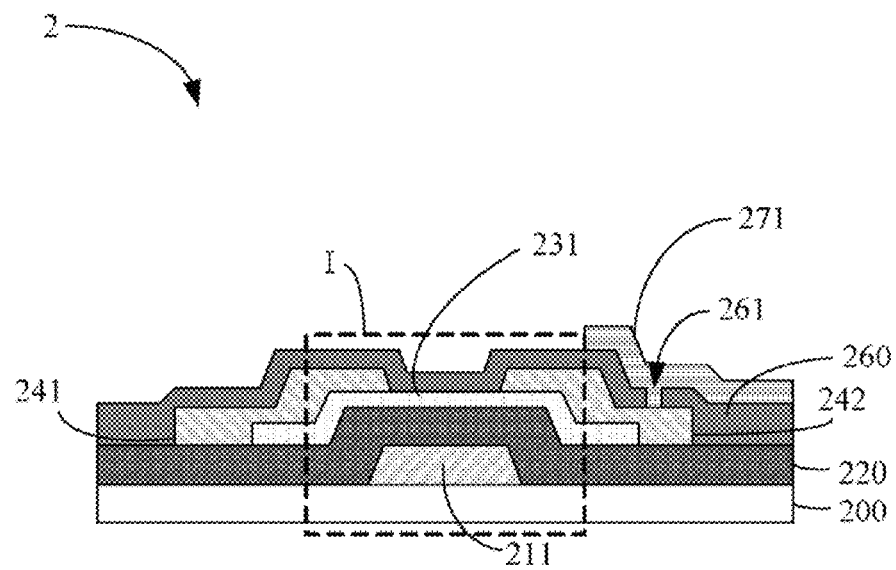
FIG. 1 is a cross-sectional view of a thin film transistor substrate in accordance with an exemplary embodiment of the present disclosure, the thin film transistor substrate including a channel layer.

FIG. 1 shows an exemplary embodiment of a thin film transistor substrate 2. The thin film transistor substrate 2 includes a substratum 200, a gate electrode 211, a gate insulating layer 220, a channel layer 231, a source electrode 241, a drain electrode 242, a passivation layer 260, a connection hole (or via) 261, and an electrode pattern 271.

The gate electrode 211 is formed on the substratum 200. In the illustrated embodiment, the substratum 200 is transparent. The gate insulating layer 220 is formed on the substratum 200 to cover the gate electrode 211. The channel layer 231 is formed on the gate insulating layer 220 corresponding to the gate electrode 211. The source electrode 241 and the drain electrode 242 are correspondingly formed at two opposite sides of the channel layer 231, and are symmetrical about the gate electrode 211. The passivation layer 260 is formed on the gate insulating layer 220 to cover the source electrode 241, the channel layer 231 and the drain electrode 242. The connection hole 261 is defined in the passivation layer 260 corresponding to the drain electrode 242. The electrode pattern 271 is formed on the passivation layer 260, and is connected to the drain electrode 242 via the connection hole 261.

The channel layer 231 is made of an amorphous oxide semiconductor (AOS), such as Indium Gallium Zinc Oxide (IGZO).

Figure 2:
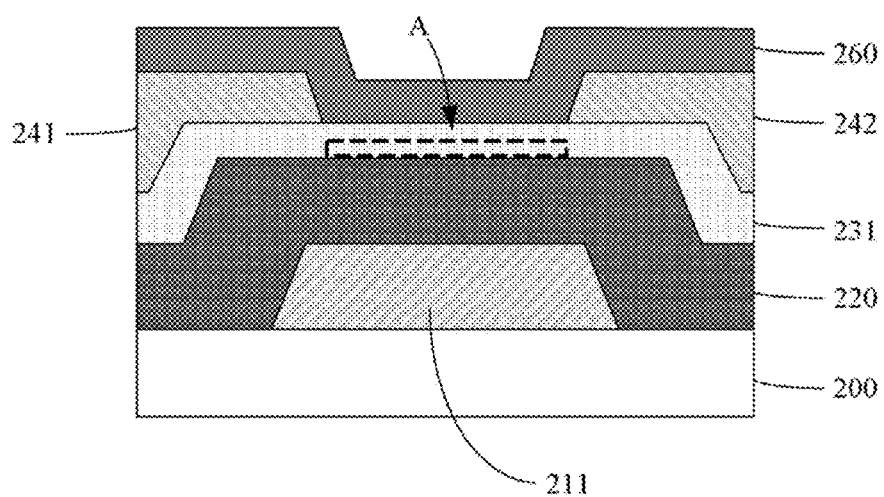
FIG. 2 is an enlarged view of a portion I of FIG. 1, showing a high oxygen ion concentration region in a lower part of the channel layer, according to a first example of the exemplary embodiment.

FIG. 2 shows details of a first example of the thin film transistor substrate 2. The channel layer 231 includes a high oxygen ion concentration region A. An oxygen ion density of the high oxygen ion concentration region A is in a range of from about $1\times10^{18}$ to about $1\times10^{21}$ per cubic centimeter. The high oxygen ion concentration region A is defined at a portion of the channel layer 231 which is adjacent to the gate insulating layer 220, and corresponds to the gate electrode 211. A thickness of the high oxygen ion concentration region A is substantially equal to or less than half of a thickness of the channel layer 231.

Figure 3:
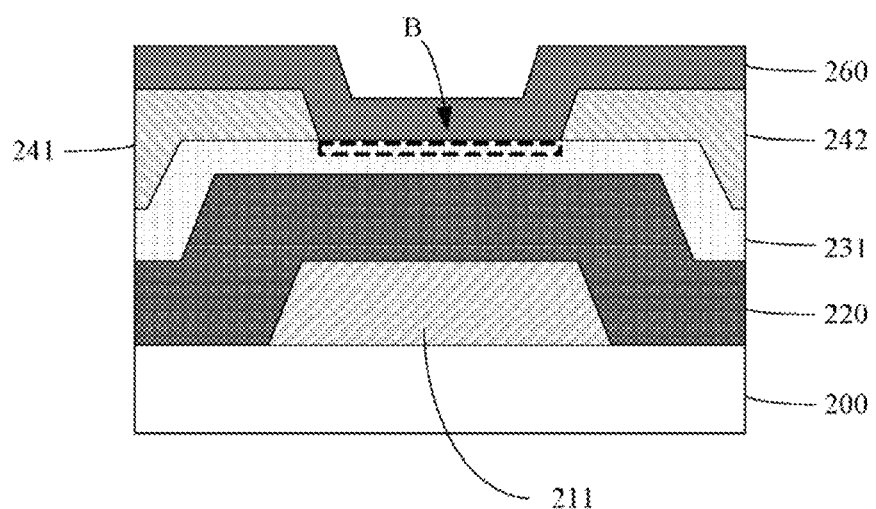
FIG. 3 is similar to FIG. 2, but showing a high oxygen ion concentration region in an upper part of the channel layer, according to a second example of the exemplary embodiment.

FIG. 3 shows details of a second example of the thin film transistor substrate 2. The channel layer 231 includes a high oxygen ion concentration region B. An oxygen ion density of the high oxygen ion concentration region B is in a range of from about $1\times10^{18}$ to about $1\times10^{21}$ per cubic centimeter. The high oxygen ion concentration region B is defined in a top part of the channel layer 231 far away from the gate insulating layer 220.

Figure 4:
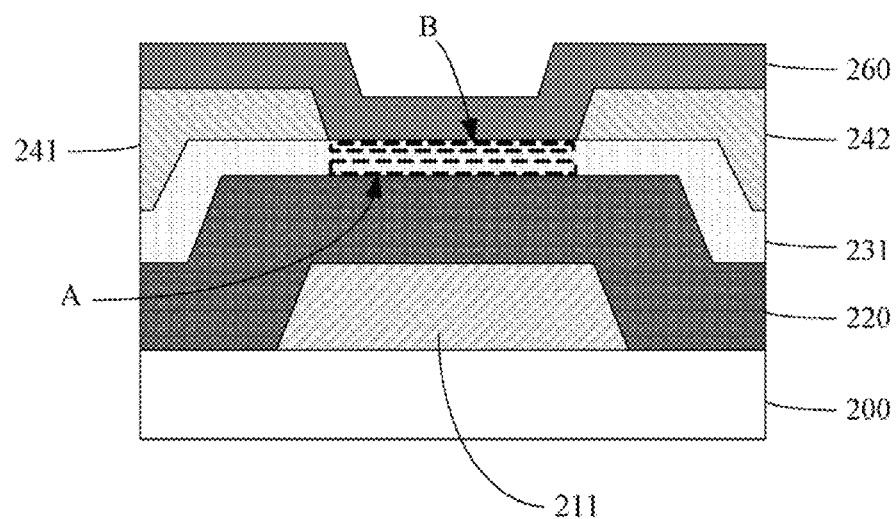
FIG. 4 is similar to FIGS. 2 and 3, but showing two high oxygen ion concentration regions in both a lower part and an upper part of the channel layer, according to a third example of the exemplary embodiment.

FIG. 4 shows details of a third example of the thin film transistor substrate 2. The channel layer 231 includes a high oxygen ion concentration region A and a high oxygen ion concentration region B. An oxygen ion density of each of the high oxygen ion concentration regions A and B is in a range of from about $1\times10^{18}$ to about $1\times10^{21}$ per cubic centimeter. The high oxygen ion concentration region A is defined at a portion of the channel layer 231 which is adjacent to the gate insulating layer 220, and corresponds to the gate electrode 211. A thickness of the high oxygen ion concentration region A is substantially equal to or less than half of a thickness of the channel layer 231. The high oxygen ion concentration region B is defined in a top part of the channel layer 231 far away from the gate insulating layer 220. A sum of the thicknesses of the high oxygen ion concentration regions A and B is less than the thickness of the channel layer 231.

Because the channel layer 231 is made of amorphous oxide semiconductor, the electron mobility of the channel layer 231 is dependent upon the oxygen ion density of the channel layer 231. In general, an amorphous oxide semiconductor has maximum electron mobility when the oxygen ion density of the amorphous oxide semiconductor is in a range of from about $1\times10^{18}$ to about $1\times10^{21}$ per cubic centimeter.

Thus, because the oxygen ion density in the high oxygen ion concentration regions A and B of the channel layer 231 in the above-described examples is in a range of from about $1\times10^{18}$ to about $1\times10^{21}$ per cubic centimeter, the channel layer 231 has maximum electron mobility.

The thin film transistor substrate 2 further includes conventionally known scan lines and data lines.

Figure 5:
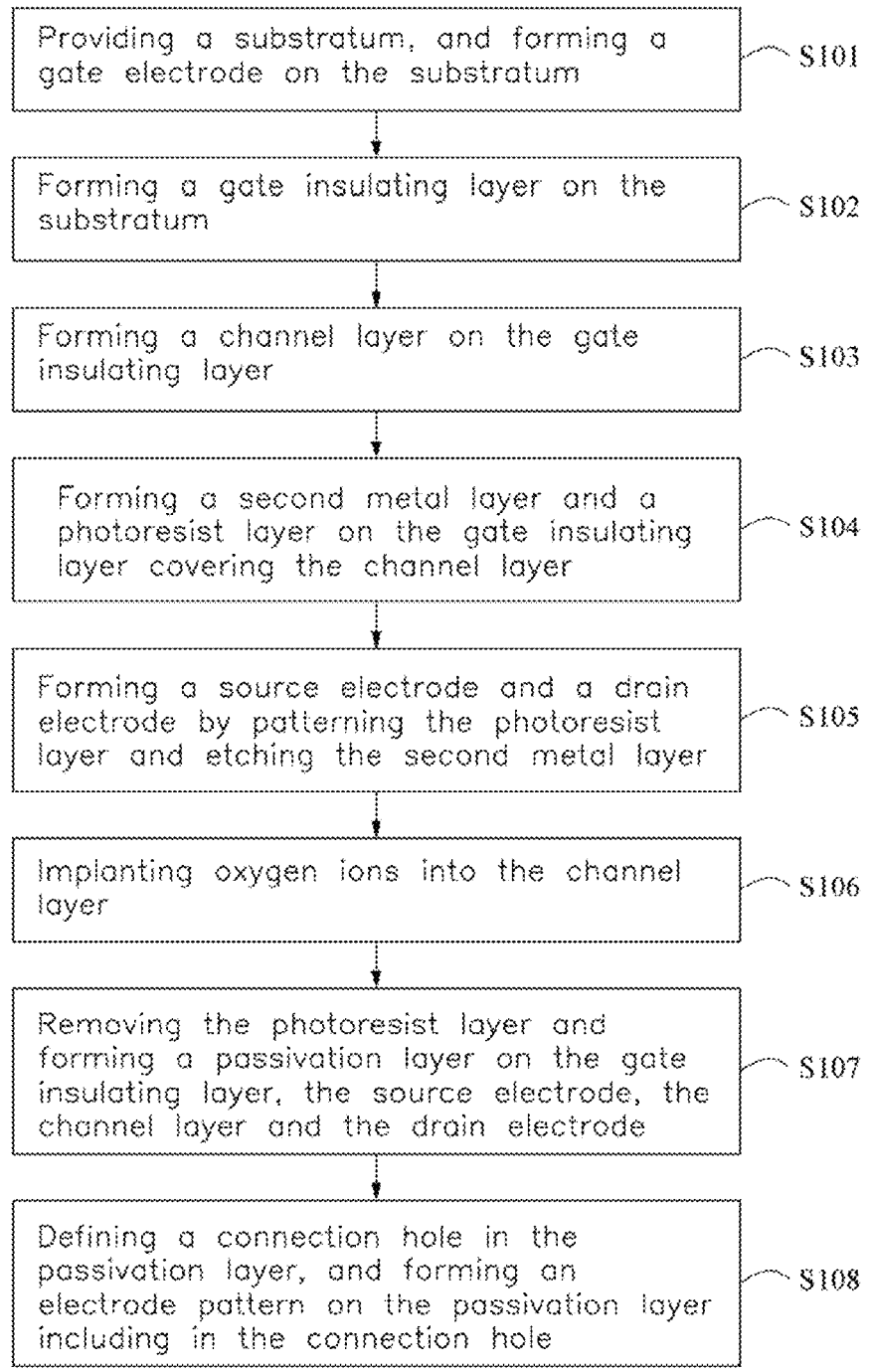
FIG. 5 is a flowchart of an exemplary embodiment of a method of manufacturing the thin film transistor substrate of FIG. 1.

FIG. 5 is a flowchart of an exemplary embodiment of a method of manufacturing the thin film transistor substrate. Depending on the embodiment, additional steps may be added, others deleted, and the ordering of the steps may be changed.

Figure 6:
FIGS. 6-24 are cross-sectional views of successive steps of the manufacturing method of FIG. 5, wherein FIGS. 17-19 respectively relate to the first, second and third examples of the exemplary embodiment.
Figure 7:
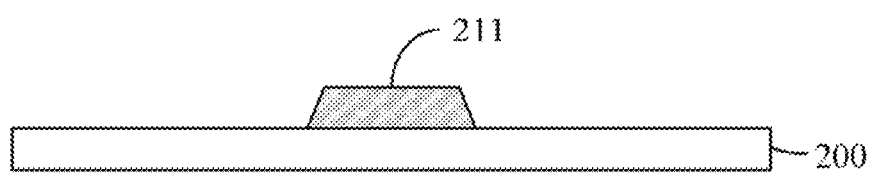

In step S101, a substratum 200 is provided, and a gate electrode 211 is formed on the substratum 200. In detail, FIG. 6 shows the substratum 200, and a first metal layer 210 formed on the substratum 200. The substratum 200 is made of transparent material, such as glass, quartz, organic material or polymer. The first metal layer 210 is made of elemental metal, alloy, metallic oxide or metallic nitride. Referring to FIG. 7, after the first metal layer 210 has been formed on the substratum 200, the gate electrode 211 is defined by patterning the first metal layer 210 using a photoresist etching process. Moreover, the scan lines are also defined by patterning the first metal layer 210 using the photoresist etching process.

Figure 8:
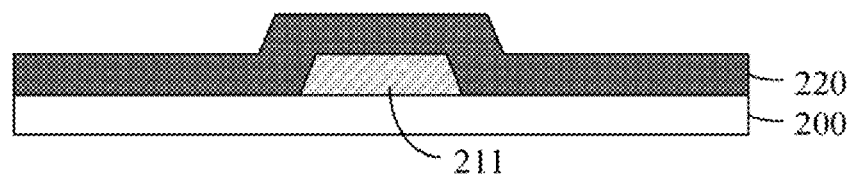

In step S102, a gate insulating layer 220 is formed on the substratum 200 to cover the gate electrode 211. In detail, FIG. 8 shows that the gate insulating layer 220 is deposited on the substratum 200 and the gate electrode 211. The gate insulating layer 220 is made of inorganic material or organic material. The gate insulating layer 220 is deposited by a plasma chemical vapor deposition process.

Figure 9:
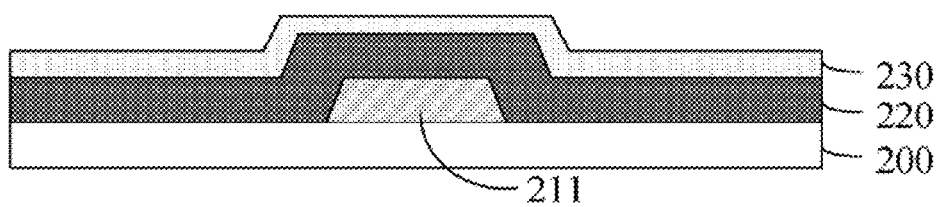
Figure 10:
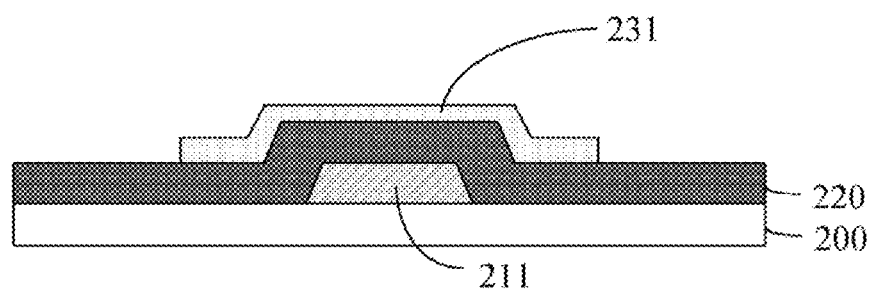

In step S103, a channel layer 231 is formed on the gate insulating layer 220 corresponding to the gate electrode 211. In detail, FIG. 9 shows that an amorphous oxide semiconductor (AOS) layer 230 is deposited on the gate insulating layer 220. The AOS layer 230 is made of, for example, Indium Gallium Zinc Oxide (IGZO). Referring to FIG. 10, after the AOS layer 230 has been deposited on the gate insulating layer 220, the position of the channel layer 231 is defined by patterning the AOS layer 230 using a photoresist etching process.

Figure 11:
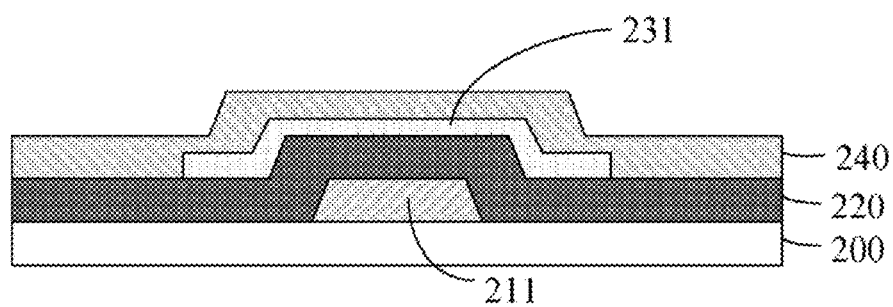
Figure 12:
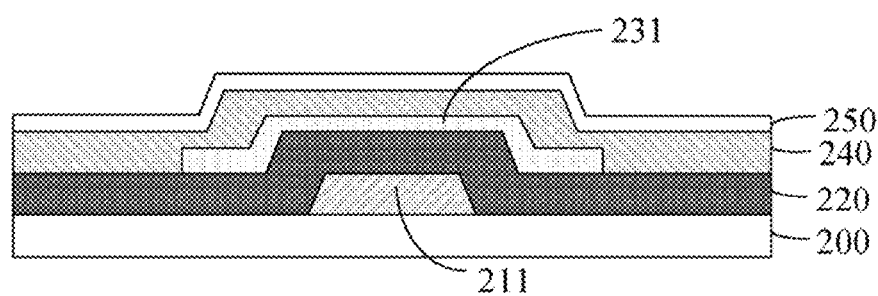

In step S104, a second metal layer 240 is formed on the gate insulating layer 220 covering the channel layer 231, and a photoresist layer 250 is formed on the second metal layer 240. In detail, FIG. 11 shows that the second metal layer 240 is formed on the gate insulating layer 220 covering the channel layer 231. The second metal layer 240 is made of elemental metal, alloy, metallic oxide or metallic nitride. Referring to FIG. 12, after the second metal layer 240 has been formed, the photoresist layer 250 is formed on the second metal layer 240. In the illustrated embodiment, the photoresist layer 250 is positive photoresist. In other embodiments, the photoresist layer 250 can be a selected negative photoresist.

Figure 13:
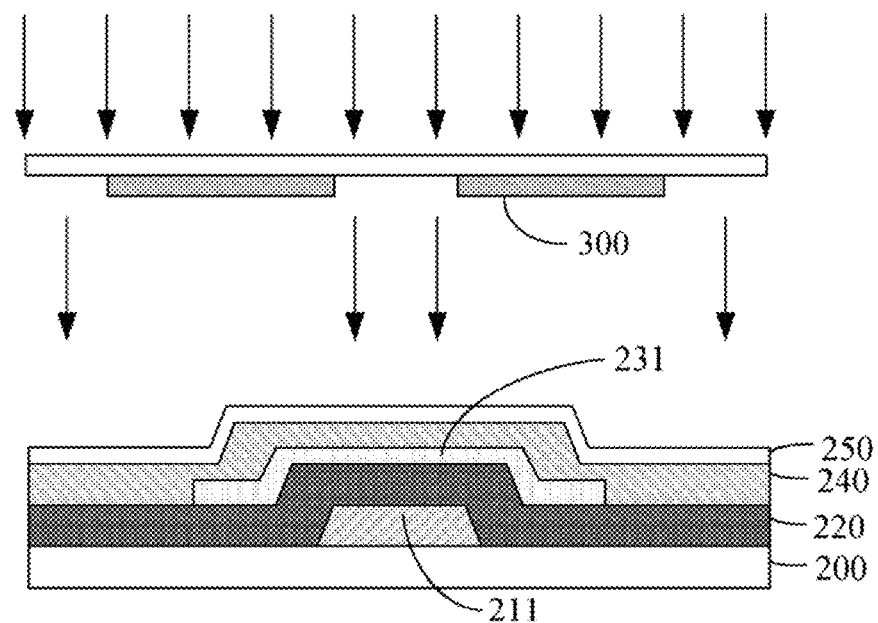
Figure 14:
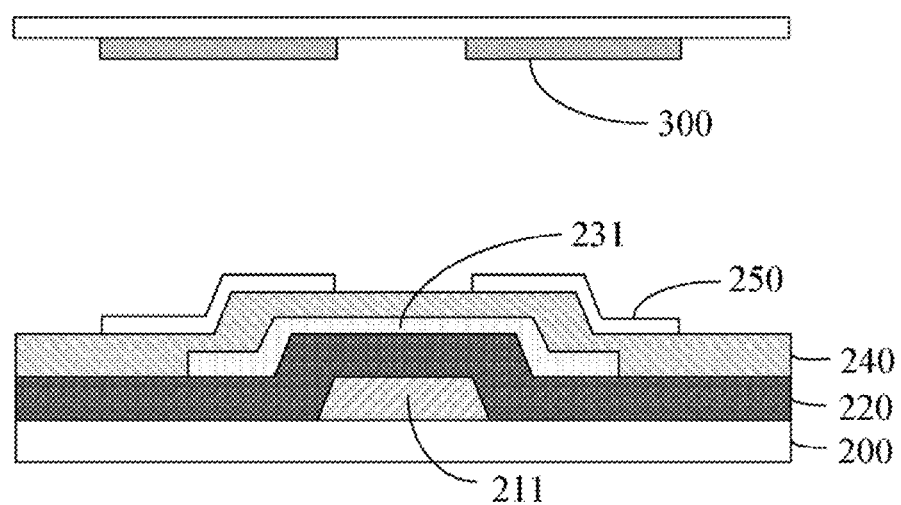
Figure 15:
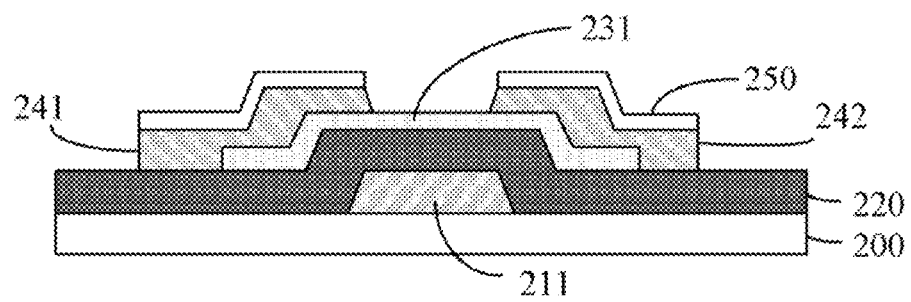

In step S105, a source electrode 241 and a drain electrode 242 are formed by patterning the photoresist layer 250 and etching the second metal layer 240. The source electrode 241 and the drain electrode 242 are correspondingly formed at two opposite sides of the channel layer 231, and are symmetrical about the gate electrode 211. In detail, FIG. 13 shows exposing the photoresist layer 250 to light from a light source, while shielding particular positions of the photoresist layer 250 from the light by using a mask 300. Then after the exposing process, referring to FIG. 14, the photoresist layer 250 is developed. In detail, the portion of the photoresist layer 250 exposed to the light is removed. Referring to FIG. 15, after the developing process, a portion of the second metal layer 240 not covered by the remaining photoresist layer 250 is etched. Thus the source electrode 241 and the drain electrode 242 are formed under the remaining photoresist layer 250. Moreover, the data lines are defined by the same etching process along with the forming of the source electrode 241 and the drain electrode 242.

Figure 16:
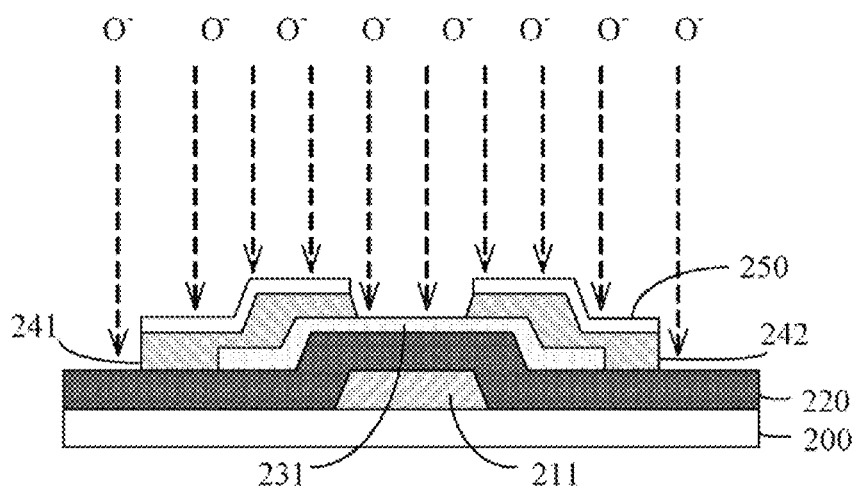

In step S106, referring to FIG. 16, oxygen ions are implanted into a portion of the channel layer 231. Because the channel layer 231 is made of amorphous oxide semiconductor, the electron mobility of the channel layer 231 is dependent upon the oxygen ion density thereof. In general, an amorphous oxide semiconductor has maximum electron mobility when the oxygen ion density of the amorphous oxide semiconductor is in a range of from about $1 \times 10^{18}$ to about $1 \times 10^{21}$ per cubic centimeter. However, a density of oxygen ions in the channel layer 231 is easily decreased during an etching process. Therefore the electron mobility in the channel layer 231 is adversely affected, and the cut off current and the threshold voltage of the finally-formed thin film transistor substrate 2 are liable to be unstable.

Thus, oxygen ions are implanted into a portion of the channel layer 231 to improve the oxygen ion concentration of the channel layer 231. The depth of the implanted oxygen ions can be controlled by modulating an implantation energy of the implanting process.

Figure 17:
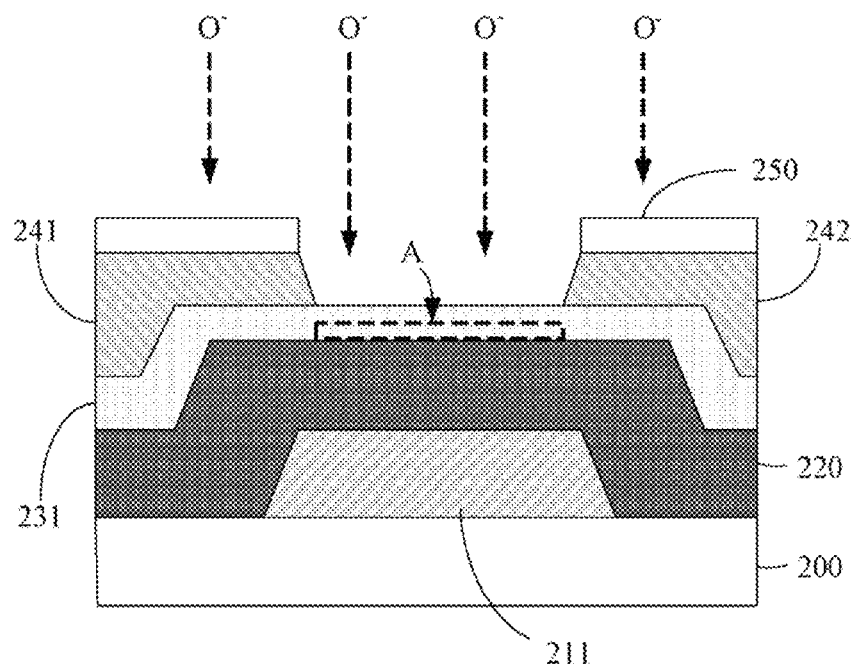

The depth of the implanted ions can be selected for any position of the channel layer 231 according to need. FIG. 17 shows that oxygen ions can be implanted into a portion of the channel layer 231 adjacent to the gate insulating layer 220 and corresponding to the gate electrode 211, in order to form a high oxygen ion concentration region A whose oxygen ion concentration is not easily adversely affected. A thickness of the high oxygen ion concentration region A is substantially equal to or less than half of a thickness of the channel layer 231. An oxygen ion density of the high oxygen ion concentration region A is in a range of from about $1 \times 10^{18}$ to about $1 \times 10^{21}$ per cubic centimeter.

Figure 18:
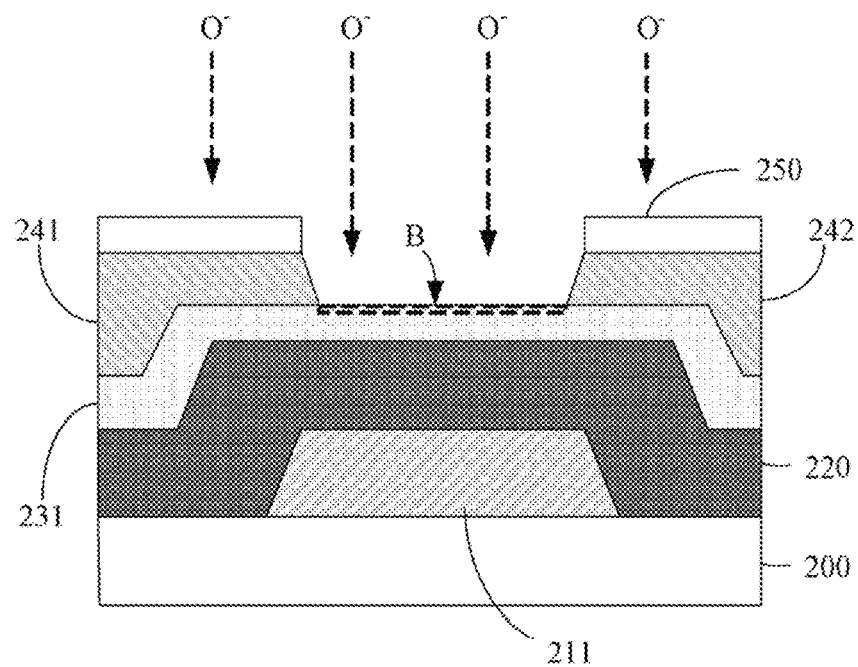

FIG. 18 shows that oxygen ions can be implanted in a top part of the channel layer 231 away from the gate insulating layer 220, in order to form a high oxygen ion concentration region B. The high oxygen ion concentration region B protects the channel layer 231 from damage while forming a passivation layer 260 after the implanting process (see below). An oxygen ion density of the high oxygen ion concentration region B is in a range of from about $1 \times 10^{18}$ to about $1 \times 10^{21}$ per cubic centimeter.

Figure 19:
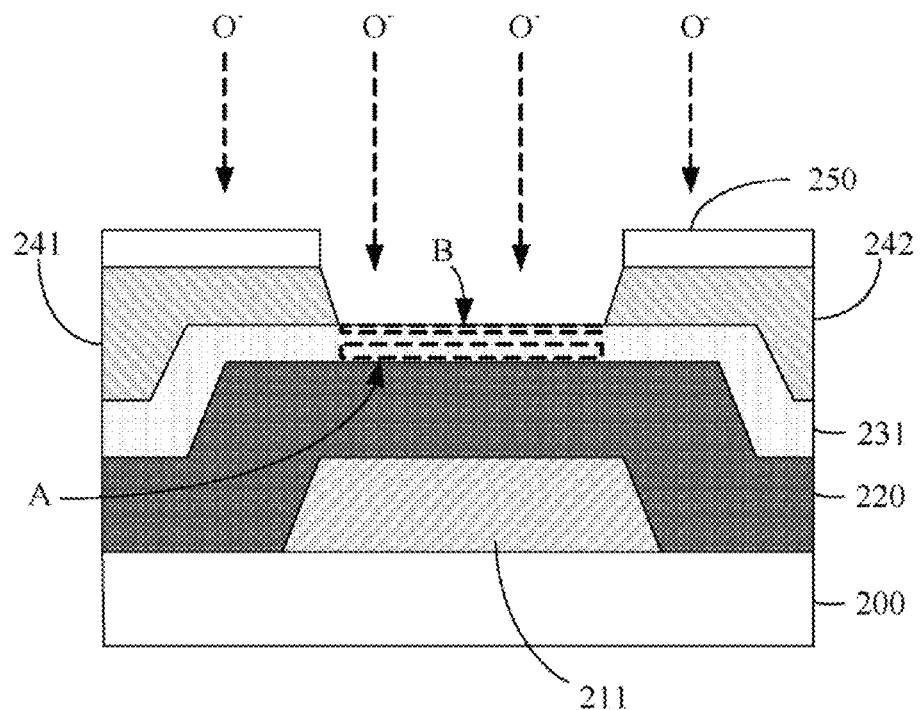

FIG. 19 shows that oxygen ions can be implanted in both a high oxygen ion concentration region A and a high oxygen ion concentration region B. The high oxygen ion concentration region A is defined at a portion of the channel layer 231 which is adjacent to the gate insulating layer 220, and corresponds to the gate electrode 211. The high oxygen ion concentration region B is defined in a top part of the channel layer 231 away from the gate insulating layer 220. A thickness of the high oxygen ion concentration region A is substantially equal to or less than half of a thickness of the channel layer 231. An oxygen ion density of each of the high oxygen ion concentration regions A and B is in a range of from about $1 \times 10^{18}$ to about $1 \times 10^{21}$ per cubic centimeter.

In all the above-described examples shown in FIGS. 17-19, the implanted ions are focused on the portion of the channel layer 231 which is not covered by the photoresist layer 250 or the source or drain electrodes 241, 242.

Figure 20:
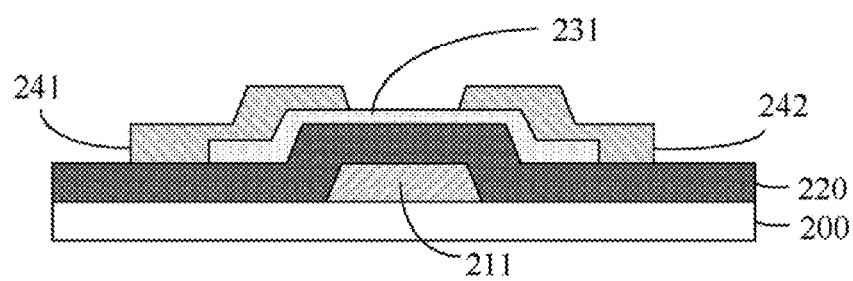
Figure 21:
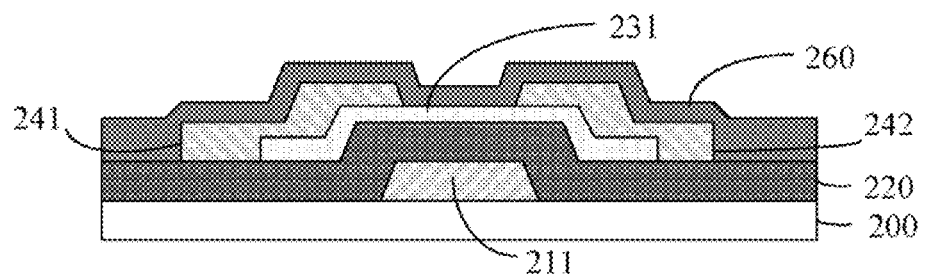

In step S107, referring to FIG. 20 and FIG. 21, the photoresist layer 250 is removed, and then the passivation layer 260 is formed on the gate insulating layer 220 and covers the source electrode 241, the channel layer 231 and the drain electrode 242. The passivation layer 260 is made of inorganic material or organic material, and serves as an insulating layer.

Figure 22:
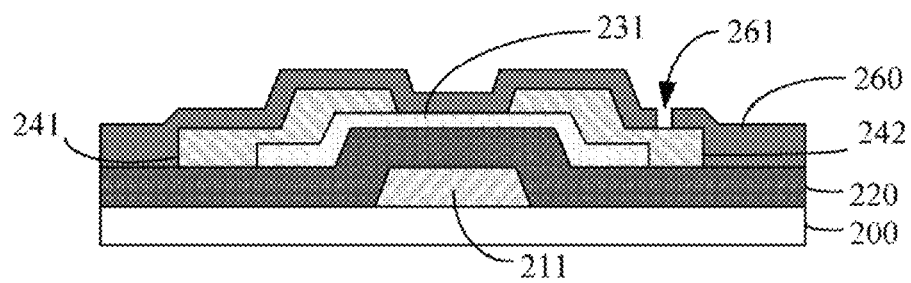
Figure 23:
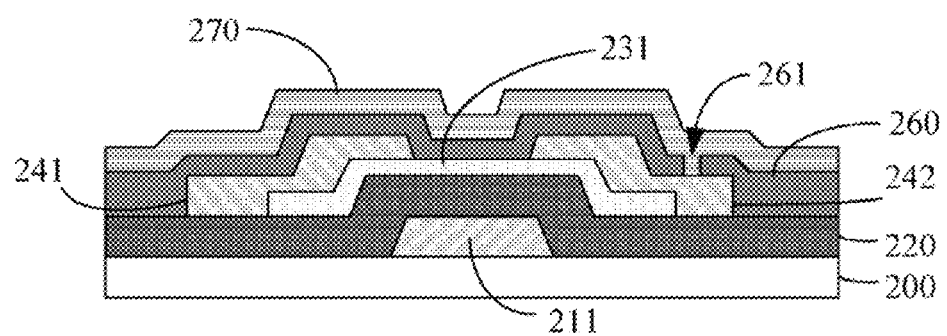
Figure 24:
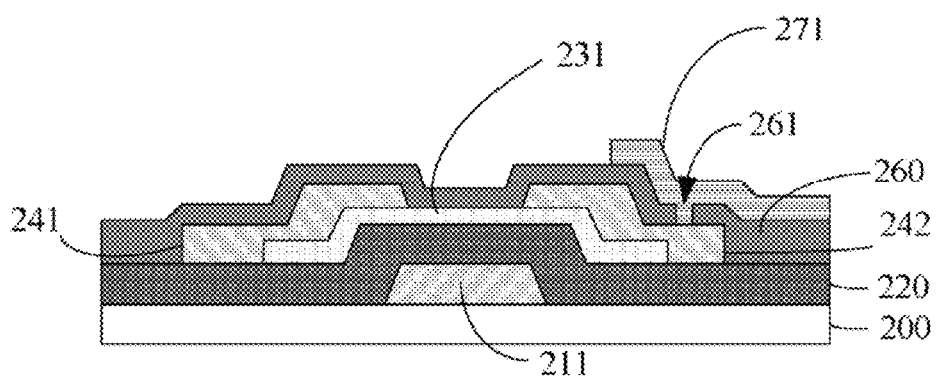

In step S108, referring to FIG. 22 through FIG. 24, a connection hole 261 is defined in the passivation layer 260 corresponding to the drain electrode 242, and an electrode pattern 271 is formed on the passivation layer 260 including in the connection hole 261. The electrode pattern 271 is connected to the drain electrode 242 via the connection hole 261. The position of the connection hole 261 is defined by patterning the passivation layer 260 using a photoresist etching process. In detail, an electrode layer 270 is deposited on the passivation layer 260 including in the connection hole 261. The electrode layer 270 is made of a transparent conducting material, such as Indium Tin Oxide (ITO) or Indium Zinc Oxide (IZO). After the electrode layer 270 has been deposited, the electrode pattern 271 is defined by patterning the electrode layer 270 using a photoresist etching process. The present thin film transistor substrate 2 is thus obtained.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method of manufacturing a thin film transistor substrate, the method comprising:
    providing a substratum;
    forming a gate electrode on the substratum;
    forming a first insulating layer on the substratum, the first insulating layer covering the gate electrode;
    forming a channel layer on the first insulating layer corresponding to the gate electrode, the channel layer made of an amorphous oxide semiconductor;
    forming a metal layer on the first insulating layer, the metal layer covering the channel layer;
    forming a photoresist layer on the metal layer;
    forming a source electrode and a drain electrode by patterning the photoresist layer and etching the metal layer, the source electrode and the drain electrode formed at two opposite sides of the channel layer and symmetrical about the gate electrode and remaining photoresist layer covering the source electrode and the drain electrode;
    implanting oxygen ions into a portion of the channel layer not covered by the source electrode and the drain electrode, thereby forming at least one high oxygen ion concentration region in the channel layer, the at least one high oxygen ion concentration region having an oxygen ion density in a range of from about $1\times10^{18}$ to about $1\times10^{21}$ per cubic centimeter;
    removing the remaining photoresist layer after implanting oxygen ions into the channel layer; and
    forming a second insulating layer on the first insulating layer, the source electrode, the channel layer and the drain electrode.

2. The method of claim 1, wherein the depth of the implanted oxygen ions is controlled by modulating an implantation energy of the implanting process.

3. The method of claim 2, wherein the at least one high oxygen ion concentration region is located at a portion of the channel layer which is adjacent to the gate insulating layer and corresponds to the gate electrode, and a thickness of the at least one high oxygen ion concentration region is substantially equal to or less than half of a thickness of the channel layer.

4. The method of claim 2, wherein the at least one high oxygen ion concentration region is located in a top part of the channel layer away from the gate insulating layer.

5. The method of claim 2, wherein the at least one high oxygen ion concentration region is a first high oxygen ion concentration region and a second high oxygen ion concentration region, the first high oxygen ion concentration region is located at a portion of the channel layer which is adjacent to the gate insulating layer and corresponds to the gate electrode, a thickness of the first high oxygen ion concentration region is substantially equal to or less than half of a thickness of the channel layer, and the second high oxygen ion concentration region is located in a top part of the channel layer away from the gate insulating layer.

6. The method of claim 1, wherein the channel layer is made of Indium Gallium Zinc Oxide.

7. The method of claim 1, further comprising, after the second insulating layer has been formed, defining a connection hole in the second insulating layer corresponding to the drain electrode and forming an electrode layer on the second insulating layer after the second insulating layer has been formed, wherein the electrode layer is connected to the drain electrode via the connection hole.

* * * * *